(12) United States Patent
Gardner et al.

(10) Patent No.: US 7,541,264 B2
(45) Date of Patent: Jun. 2, 2009

(54) TEMPORARY WAFER BONDING METHOD FOR SEMICONDUCTOR PROCESSING

(75) Inventors: Geoffrey Bruce Gardner, Gilbert, AZ (US); Brian Robert Harkness, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 2 days.

(21) Appl. No.: 11/795,423

(22) PCT Filed: Feb. 7, 2006

(86) PCT No.: PCT/US2006/004449

§ 371 (c)(1),
(2), (4) Date: Jul. 17, 2007

(87) PCT Pub. No.: WO2006/093639

PCT Pub. Date: Sep. 8, 2006

(65) Prior Publication Data

US 2008/0090380 A1      Apr. 17, 2008

Related U.S. Application Data

(60) Provisional application No. 60/657,630, filed on Mar. 1, 2005.

(51) Int. Cl.
  H01L 21/30    (2006.01)
  H01L 21/46    (2006.01)
(52) U.S. Cl. .............................. 438/459; 257/E21.122
(58) Field of Classification Search ................ 438/459; 257/E21.122

See application file for complete search history.

(56) References Cited

U.S. PATENT DOCUMENTS

| 2,676,182 | A | 4/1954 | Daudt et al. |
|---|---|---|---|
| 3,159,601 | A | 12/1964 | Ashby et al. |
| 3,220,972 | A | 11/1965 | Lamoreaux |
| 3,296,291 | A | 1/1967 | Chalk et al. |
| 3,419,593 | A | 12/1968 | Willing |
| 3,516,946 | A | 6/1970 | Modic |
| 3,814,730 | A | 6/1974 | Karstedt et al. |
| 3,989,668 | A | 11/1976 | Lee et al. |
| 4,087,585 | A | 5/1978 | Schulz et al. |
| 4,584,355 | A | 4/1986 | Blizzard et al. |
| 4,585,836 | A | 4/1986 | Homan et al. |
| 4,591,622 | A | 5/1986 | Blizzard et al. |
| 4,766,176 | A | 8/1988 | Lee et al. |
| 4,784,879 | A | 11/1988 | Lee et al. |
| 5,017,654 | A | 5/1991 | Togashi et al. |
| 5,036,117 | A | 7/1991 | Chung et al. |
| 5,175,325 | A | 12/1992 | Brown et al. |
| 5,194,649 | A | 3/1993 | Okawa |
| 5,248,715 | A | 9/1993 | Gray et al. |
| 5,744,507 | A | 4/1998 | Angell et al. |
| 6,169,142 | B1 | 1/2001 | Nakano et al. |

FOREIGN PATENT DOCUMENTS

| EP | 0 493 791 A1 | 7/1992 |
|---|---|---|
| EP | 0 347 895 B1 | 11/1993 |
| EP | 0 497 349 B1 | 6/1996 |
| EP | 1 101 167 B1 | 4/2006 |
| WO | WO 2004/000942 A1 | 12/2003 |
| WO | WO 2005/001573 A1 | 1/2005 |
| WO | WO 2005/017627 A1 | 2/2005 |

*Primary Examiner*—W. David Coleman
(74) *Attorney, Agent, or Firm*—Catherine U. Brown

(57) ABSTRACT

A method for temporary wafer bonding employs an addition reaction curable adhesive composition. The adhesive composition may include (A) a polyorganosiloxane containing an average of at least two silicon-bonded unsaturated organic groups per molecule, (B) an organosilicon compound containing an average of at least two silicon-bonded hydrogen atoms per molecule in an amount sufficient to cure the composition, (C) a catalytic amount of a hydrosilylation catalyst, and (D) a solvent. The film prepared by curing the composition is removable with an etching solution.

19 Claims, No Drawings

TEMPORARY WAFER BONDING METHOD FOR SEMICONDUCTOR PROCESSING

CROSS REFERENCE TO RELATED APPLICATIONS

This application is a U.S. national stage filing under 35 U.S.C. §371 of PCT Application No. PCT/US06/004449 filed on 7 Feb. 2006, currently pending, which claims the benefit of U.S. Provisional Patent Application No. 60/657,630 filed 1 Mar. 2005 under 35 U.S.C. §119 (e). PCT Application No. PCT/US06/004449 and U.S. Provisional Patent Application No. 60/657,630 are hereby incorporated by reference.

TECHNICAL FIELD

This invention relates to a method for bonding a wafer to a substrate using an addition reaction curable adhesive composition.

BACKGROUND

As market pressures drive manufacturers toward thinner die packages, one method for reducing the overall height of the package has been thinning of the silicon die. The thinning operation is most efficiently performed on the silicon wafer prior to die singulation. However, as wafers get larger and the die get thinner, the overall structural integrity of the wafer is reduced. As a result, the large, thin wafers may break when processed using existing equipment and materials.

One proposed solution to this problem is to adhesively bind the wafer to a reinforcing substrate (such as another wafer or a wafer carrier) to increase mechanical strength, perform the desired processing, e.g., thinning, and release the wafer before singulation. The adhesive and substrate in this process act as a mechanical support to provide the structural stability during processing.

PROBLEM TO BE SOLVED

There is a need in the semiconductor industry for a temporary wafer bonding process using an adhesive having properties to allow for processing the wafer. The adhesive should be capable of being applied by an industrially acceptable method (such as spray coating, printing, dipping, or spin coating), should be capable of withstanding processing at temperatures above 200° C. for several hours, should be robust to various commonly used electronic chemicals, and should release cleanly from the wafer on command.

SUMMARY

This invention relates to a wafer processing method. The method comprises:

(1) forming a film by applying an addition reaction curable adhesive composition to a first substrate, and
 optionally (2) heating the product of step (1),
(3) applying a second substrate to the film, where at least one of the first substrate and the second substrate is a semiconductor wafer,
(4) curing the film to form a cured film,
(5) processing the semiconductor wafer, and
(6) removing the cured film with an etching solution.

DETAILED DESCRIPTION

All amounts, ratios, and percentages are by weight unless otherwise indicated.

Adhesive Composition

The adhesive composition for use in the method of this invention may be any adhesive composition that does not evolve substantial by-products from its curing reaction. The adhesive composition may be an addition reaction curable adhesive composition. Addition reaction curable adhesive compositions include, but are not limited to, acrylate curable, epoxy curable, hydrosilylation curable, and methacrylate curable. A hydrosilylation curable adhesive composition for use in the method of this invention comprises:

(A) a polyorganosiloxane containing an average of at least two silicon-bonded unsaturated organic groups per molecule, (B) an organosilicon compound containing an average of at least two silicon-bonded hydrogen atoms per molecule in an amount sufficient to cure the composition, and (C) a catalytic amount of a hydrosilylation catalyst.

Component (A) Polyorganosiloxane

Component (A) comprises at least one polyorganosiloxane containing an average of at least two silicon-bonded unsaturated organic groups per molecule. These unsaturated organic groups are capable of undergoing a hydrosilylation reaction and are exemplified by alkenyl groups. The polyorganosiloxane may have a linear, branched, or resinous structure. The polyorganosiloxane may be a homopolymer or a copolymer. The unsaturated organic groups may have 2 to 10 carbon atoms and are exemplified by, but not limited to, alkenyl groups such as vinyl, allyl, butenyl, and hexenyl. The unsaturated organic groups in the polyorganosiloxane may be located at terminal, pendant, or both terminal and pendant positions.

The remaining silicon-bonded organic groups in the polyorganosiloxane are organic groups free of aliphatic unsaturation. These organic groups may be independently selected from monovalent hydrocarbon and monovalent halogenated hydrocarbon groups free of aliphatic unsaturation. These monovalent groups may have from 1 to 20 carbon atoms, alternatively 1 to 10 carbon atoms, and are exemplified by, but not limited to alkyl such as methyl, ethyl, propyl, pentyl, octyl, undecyl, and octadecyl; cycloalkyl such as cyclohexyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. At least 50 percent, alternatively at least 80%, of the organic groups free of aliphatic unsaturation in the polyorganosiloxane may be methyl.

The viscosity of the polyorganosiloxane at 25° C. varies with molecular weight and structure, but may be 0.001 to 100,000 Pascal·seconds (Pa·s), alternatively 0.01 to 10,000 Pa·s, and alternatively 0.01 to 1,000 Pa·s.

Examples of polyorganosiloxanes useful in the adhesive composition include, but are not limited to, polydiorganosiloxanes having the following formulae: $ViMe_2SiO(Me_2SiO)_a SiMe_2Vi$, $ViMe_2SiO(Me_2SiO)_{0.25a}(MePhSiO)_{0.75a}SiMe_2Vi$, $ViMe_2SiO(Me_2SiO)_{0.95a}(Ph_2SiO)_{0.05a}SiMe_2Vi$, $ViMe_2SiO(Me_2SiO)_{0.98a}(MeViSiO)_{0.02a}SiMe_2Vi$, $Me_3SiO(Me_2SiO)_{0.95a}(MeViSiO)_{0.05a}SiMe_3$, and $PhMeViSiO(Me_2SiO)_a SiPhMeVi$, where Me, Vi, and Ph denote methyl, vinyl, and phenyl respectively and subscript a has a value such that the viscosity of the polydiorganosiloxane is 0.001 to 100,000 Pa·s.

Methods of preparing polyorganosiloxanes suitable for use in the adhesive composition, such as hydrolysis and condensation of the corresponding organohalosilanes or equilibration of cyclic polydiorganosiloxanes, are known in the art.

Examples of polyorganosiloxane resins include an MQ resin consisting essentially of $R^1_3SiO_{1/2}$ units and $SiO_{4/2}$ units, a TD resin consisting essentially of $R^1SiO_{3/2}$ units and $R^1{}_2SiO_{2/2}$ units, an MT resin consisting essentially of $R^1{}_3SiO_{1/2}$ units and $R^1SiO_{3/2}$ units, and an MTD resin consisting essentially of $R^1{}_3SiO_{1/2}$ units, $R^1SiO_{3/2}$ units, and $R^1{}_2SiO_{2/2}$ units, wherein each $R^1$ is independently selected from monovalent hydrocarbon and monovalent halogenated hydrocarbon groups. The monovalent groups represented by $R^1$ may have 1 to 20 carbon atoms, alternatively 1 to 10 carbon atoms.

Examples of monovalent groups for $R^1$ include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. Alternatively, at least one-third, and alternatively substantially all $R^1$ groups in the polyorganosiloxane resin may be methyl. An exemplary polyorganosiloxane resin consists essentially of $(CH_3)_3SiO_{1/2}$ siloxane units and $SiO_{4/2}$ where the mole ratio of $(CH_3)_3SiO_{1/2}$ units to $SiO_{4/2}$ units is 0.6 to 1.9.

The polyorganosiloxane resin may contain an average of 3 to 30 mole percent of unsaturated organic groups capable of undergoing a hydrosilylation reaction, such as alkenyl groups. The mole percent of unsaturated organic groups in the resin is the ratio of the number of moles of unsaturated organic group-containing siloxane units in the resin to the total number of moles of siloxane units in the resin, multiplied by 100.

The polyorganosiloxane resin may be prepared by methods known in the art. For example, the polyorganosiloxane resin may prepared by treating a resin copolymer produced by the silica hydrosol capping process of Daudt, et al. with at least an alkenyl-containing endblocking reagent. The method of Daudt, et al. is disclosed in U.S. Pat. No. 2,676,182.

Briefly stated, the method of Daudt, et al. involves reacting a silica hydrosol under acidic conditions with a hydrolyzable triorganosilane such as trimethylchlorosilane, a siloxane such as hexamethyldisiloxane, or a combination thereof, and recovering a copolymer having M and Q units. The resulting copolymers may contain 2 to 5 percent by weight of hydroxyl groups.

The polyorganosiloxane resin, which may contain less than 2 percent by weight of silicon-bonded hydroxyl groups, may be prepared by reacting the product of Daudt, et al. with an alkenyl-containing endblocking agent or a mixture of an alkenyl-containing endblocking agent and an endblocking agent free of aliphatic unsaturation in an amount sufficient to provide 3 to 30 mole percent of alkenyl groups in the final product. Examples of endblocking agents include, but are not limited to, silazanes, siloxanes, and silanes. Suitable endblocking agents are known in the art and are exemplified in U.S. Pat. Nos. 4,584,355; 4,591,622; and 4,585,836. A single endblocking agent or a mixture of endblocking agents may be used to prepare the polyorganosiloxane resin.

Component (A) may be a single polyorganosiloxane or a combination comprising two or more polyorganosiloxanes that differ in at least one of the following properties: structure, viscosity, average molecular weight, siloxane units, and sequence. The exact amount of component (A) that may be added to the composition depends on various factors including the type of components (A) and (B) and the amount of component (B) in the composition and the ratio of silicon-bonded hydrogen atoms to unsaturated organic groups capable of undergoing a hydrosilylation reaction in components (SiH:vinyl ratio) of the composition. However, the amount of component (A) may be 20% to 80% based on the weight of the composition.

Component (B) Organosilicon Compound

Component (B) is at least one organosilicon compound containing an average of at least two silicon-bonded hydrogen atoms per molecule. It is generally understood that crosslinking occurs when the sum of the average number of alkenyl groups per molecule in component (A) and the average number of silicon-bonded hydrogen atoms per molecule in component (B) is greater than four. The silicon-bonded hydrogen atoms in the component (B) may be located at terminal, pendant, or at both terminal and pendant positions.

The organosilicon compound may be an organosilane or an organohydrogensiloxane. The organosilane may be a monosilane, disilane, trisilane, or polysilane. Similarly, the organohydrogensiloxane may be a disiloxane, trisiloxane, or polysiloxane. The organosilicon compound may be an organohydrogensiloxane or the organosilicon compound may be an organohydrogenpolysiloxane. The structure of the organosilicon compound may be linear, branched, cyclic, or resinous. At least 50 percent of the organic groups in the organosilicon compound may be methyl.

Examples of organosilanes include, but are not limited to, monosilanes such as diphenylsilane and 2-chloroethylsilane; disilanes such as 1,4-bis(dimethylsilyl)benzene, bis[(p-dimethylsilyl)phenyl]ether, and 1,4-dimethyldisilylethane; trisilanes such as 1,3,5-tris(dimethylsilyl)benzene and 1,3,5-trimethyl-1,3,5-trisilane; and polysilanes such as poly(methylsilylene)phenylene and poly(methylsilylene)methylene.

Examples of organohydrogensiloxanes include, but are not limited to, disiloxanes such as 1,1,3,3-tetramethyldisiloxane and 1,1,3,3-tetraphenyldisiloxane; trisiloxanes such as phenyltris(dimethylsiloxy)silane and 1,3,5-trimethylcyclotrisiloxane; and polysiloxanes such as a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a resin consisting essentially of $H(CH_3)_2SiO_{1/2}$ units, $(CH_3)_3SiO_{1/2}$ units, and $SiO_{4/2}$ units.

Component (B) may be a single organosilicon compound or a combination comprising two or more such compounds that differ in at least one of the following properties: structure, average molecular weight, viscosity, silane units, siloxane units, and sequence.

The amount of component (B) in the adhesive composition of the present invention is sufficient to cure the composition. The exact amount of component (B) depends on the desired extent of cure, which generally increases as the SiH:vinyl ratio increases. The amount of component (B) may be sufficient to provide from 0.5 to 3 silicon-bonded hydrogen atoms per alkenyl group in component (A). Alternatively, the concentration of component (B) is sufficient to provide 0.7 to 1.2 silicon-bonded hydrogen atoms per alkenyl group in component (A). However, the amount of component (B) may be 20% to 80% based on the weight of the composition.

Methods of preparing organosilicon compounds containing silicon-bonded hydrogen atoms are known in the art. For example, organopolysilanes may be prepared by reaction of chlorosilanes in a hydrocarbon solvent in the presence of sodium or lithium metal (Wurtz reaction). Organopolysiloxanes may be prepared by hydrolysis and condensation of organohalosilanes.

To improve compatibility of components (A) and (B), the predominant organic group in each component may be the same. For example, this group may be methyl.

Component (C) Catalyst

Suitable hydrosilylation catalysts are known in the art and commercially available. Component (C) may comprise a platinum group metal selected from platinum, rhodium, ruthenium, palladium, osmium or iridium metal or organometallic compound thereof, or a combination thereof. Component (C) is exemplified by compounds such as chloroplatinic acid, chloroplatinic acid hexahydrate, platinum dichloride, platinum acetyl acetonate, and complexes of said compounds with low molecular weight organopolysiloxanes or platinum compounds microencapsulated in a matrix or coreshell type structure. Complexes of platinum with low molecular weight organopolysiloxanes include 1,3-diethenyl-1,1,3,3-tetramethyldisiloxane complexes with platinum. These complexes may be microencapsulated in a resin matrix.

Suitable hydrosilylation catalysts for component (C) are described in, for example, U.S. Pat. Nos. 3,159,601; 3,220,972; 3,296,291; 3,419,593; 3,516,946; 3,814,730; 3,989,668; 4,784,879; 5,036,117; and 5,175,325 and EP 0 347 895 B. Microencapsulated hydrosilylation catalysts and methods of preparing them are known in the art, as exemplified in U.S. Pat. No. 4,766,176 and the references cited therein; and U.S. Pat. No. 5,017,654.

The concentration of component (C) is sufficient to catalyze the hydrosilylation reaction of components (A) and (B) upon exposure to heat in the method described herein. The amount of component (C) may be from 0.1 to 1000 parts per million (ppm) of platinum group metal, alternatively from 0.5 to 100 ppm of platinum group metal, and alternatively from 1 to 25 ppm of platinum group metal, based on the combined weight of components (A), (B), and (C). The rate of cure may be slow below 1 ppm of platinum group metal. The use of more than 100 ppm of platinum group metal may be uneconomical or may reduce stability of the adhesive composition.

Optional Components

The adhesive composition may further comprise one or more optional components, provided the optional component does not adversely affect cure of the adhesive composition in the method of this invention. Examples of optional components include, but are not limited to, (D) a solvent, (E) an inhibitor, (F) a filler, (G) a treating agent, (H) a spacer, (I) an adhesion promoter, (J) a surfactant, (K) a colorant such as a pigment or dye, and a combination thereof.

Component (D) Solvent

The adhesive composition may optionally further comprise a solvent. Suitable solvents are known in the art and are commercially available. The solvent may be an organic solvent having from 3 to 20 carbon atoms. Examples of solvents include aliphatic hydrocarbons, such as nonane, decalin, and dodecane; aromatic hydrocarbons, such as mesitylene, xylene, and toluene; esters, such as ethyl acetate and γ-butyrolactone; ethers, such as n-butyl ether and polyethylene glycol monomethylether; ketones, such as methyl isobutyl ketone and methyl pentyl ketone; silicone fluids such as linear, branched, and cyclic polydimethylsiloxanes and combinations of such solvents. The optimum concentration of a particular solvent in an adhesive composition can be readily determined by routine experimentation. However, the amount of solvent may be 0% to 95% based on the weight of the composition, alternatively 1% to 95%.

Component (E) Inhibitor

Combinations of components (A), (B), and (C) may begin to cure at ambient temperature. To obtain a longer working time or "pot life", the activity of the catalyst under ambient conditions may be retarded or suppressed by the addition of optional component (E), an inhibitor to the adhesive composition. An inhibitor retards curing of the present adhesive composition at ambient temperature, but does not prevent the composition from curing at elevated temperatures. Suitable inhibitors include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-1-cyclohexanol, and 2-phenyl-3-butyn-2-ol; maleates and fumarates, such as the well known dialkyl, dialkenyl, and dialkoxyalkyl fumarates and maleates; and cyclovinylsiloxanes.

The amount of inhibitor in the adhesive composition is sufficient to retard curing of the composition at ambient temperature without preventing or excessively prolonging cure at elevated temperatures. This amount will vary depending on the particular inhibitor used, the nature and amount of component (C), and the nature of the component (B). However, inhibitor concentrations as low as one mole of inhibitor per mole of platinum group metal may yield a satisfactory storage stability and cure rate. Inhibitor concentrations of up to 500 or more moles of inhibitor per mole of platinum group metal may be used. One skilled in the art would be able to determine the optimum concentration for a particular inhibitor in a particular adhesive composition by routine experimentation.

Component (F)

Optional component (F) is a filler. Component (F) may comprise a thermally conductive filler, a reinforcing filler, or a combination thereof. Suitable thermally conductive fillers for component (F) include metal particles, metal oxide particles, and a combination thereof. Suitable thermally conductive fillers for component (F) are exemplified by aluminum nitride; aluminum oxide; barium titanate; beryllium oxide; boron nitride; diamond; graphite; magnesium oxide; metal particulate such as copper, gold, nickel, or silver; silicon carbide; tungsten carbide; zinc oxide, and a combination thereof.

Thermally conductive fillers are known in the art and commercially available, see for example, U.S. Pat. No. 6,169,142 (col. 4, lines 7-33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company. Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

Reinforcing fillers include silica, and chopped fiber, such as chopped KEVLAR®.

A combination of fillers having differing particle sizes and different particle size distributions may be used as component (F).

Component (G) Treating Agent

The filler may optionally be surface treated with component (G) a treating agent. Treating agents and treating methods are known in the art, see for example, U.S. Pat. No. 6,169,142 (col. 4, line 42 to col. 5, line 2).

The treating agent may be an alkoxysilane having the formula: $R^3_c Si(OR^4)_{(4-c)}$, where c is 1, 2, or 3; alternatively c is 3. $R^3$ is a substituted or unsubstituted monovalent hydrocarbon group of 1 to 50 carbon atoms, alternatively 8 to 30 carbon atoms, alternatively 1 to 18 carbon atoms. $R^3$ is exemplified by alkyl groups such as hexyl, octyl, dodecyl, tetradecyl, hexadecyl, and octadecyl; and aromatic groups such as benzyl, phenyl and phenylethyl. $R^3$ may be saturated or unsaturated, branched or unbranched, and unsubstituted. $R^3$ may be saturated, unbranched, and unsubstituted.

$R^4$ is an unsubstituted, saturated hydrocarbon group of at least 1 carbon atom. $R^4$ may have 1 to 4 carbon atoms, alternatively 1 to 2 carbon atoms. Component (G) is exemplified by hexyltrimethoxysilane, octyltriethoxysilane, decyltrimethoxysilane, dodecyltrimethyoxysilane, tetradecyltrimethoxysilane, phenyltrimethoxysilane, octadecyltrimethoxysilane, octadecyltriethoxysilane, and a combination thereof.

Alkoxy-functional oligosiloxanes may also be used as component (G). Alkoxy-functional oligosiloxanes and methods for their preparation are known in the art, see for example, EP 1 101 167 A2. For example, suitable alkoxy-functional oligosiloxanes include those of the formula $(R^7O)_d Si(OSiR^5_2 R^6)_{4-d}$. In this formula, d is 1, 2, or 3, alternatively d is 3. Each $R^5$ is may be independently selected from saturated and unsaturated monovalent hydrocarbon groups of 1 to 10 carbon atoms. Each $R^6$ may be a saturated or unsaturated monovalent hydrocarbon group having at least 11 carbon atoms. Each $R^7$ may be an alkyl group.

Metal fillers may be treated with alkylthiols such as octadecyl mercaptan, and fatty acids such as oleic acid, stearic acid, titanates, titanate coupling agents, zirconate coupling agents, and a combination thereof.

Treating agents for alumina or passivated aluminum nitride could include alkoxysilyl functional alkylmethyl polysiloxanes (e.g., partial hydrolysis condensate of $R^8_e R^9_f Si(OR^{10})_{(4-e-f)}$ or cohydrolysis condensates or mixtures), similar materials where the hydrolyzable group would be silazane, acyloxy or oximo. In all of these, a group tethered to Si, such as $R^8$ in the formula above, is an unsaturated monovalent hydrocarbon or monovalent aromatic-functional hydrocarbon. $R^9$ is a monovalent hydrocarbon group, and $R^{10}$ is a monovalent hydrocarbon group of 1 to 4 carbon atoms. In the formula above, e is 1, 2, or 3 and f is 0, 1, or 2, with the proviso that e+f is 1, 2, or 3. One skilled in the art could optimize a specific treating agent to aid dispersion of the filler by routine experimentation.

Component (H)

Optional component (H) is a spacer. Spacers may comprise organic particles, inorganic particles, or a combination thereof. Spacers may be thermally conductive, electrically conductive, or both. Spacers may have a particle size of at least 25 micrometers up to 250 micrometers. Spacers may comprise monodisperse beads. Spacers are exemplified by, but not limited to, polystyrene, glass, perfluorinated hydrocarbon polymers, and a combination thereof. Spacers may be added in addition to, or instead of, all or a portion of the filler. Spacers may be treated with component (G).

Component (I)

Component (I) is an adhesion promoter. Component (I) may comprise a transition metal chelate, an alkoxysilane, a combination of an alkoxysilane and a hydroxy-functional polyorganosiloxane, or a combination thereof.

Component (I) may be an unsaturated or epoxy-functional compound. Suitable epoxy-functional compounds are known in the art and commercially available, see for example, U.S. Pat. Nos. 4,087,585; 5,194,649; 5,248,715; and 5,744,507 col. 4-5. Component (I) may comprise an unsaturated or epoxy-functional alkoxysilane. For example, the functional alkoxysilane may have the formula $R^{11}_g Si(OR^{12})_{(4-g)}$, where g is 1, 2, or 3, alternatively g is 1.

Each $R^{11}$ is independently a monovalent organic group with the proviso that at least one $R^{11}$ is an unsaturated organic group or an epoxy-functional organic group. Epoxy-functional organic groups for $R^{11}$ are exemplified by 3-glycidoxypropyl and (epoxycyclohexyl)ethyl. Unsaturated organic groups for $R^{11}$ are exemplified by 3-methacryloyloxypropyl, 3-acryloyloxypropyl, and unsaturated monovalent hydrocarbon groups such as vinyl, allyl, hexenyl, undecylenyl.

Each $R^{12}$ is independently an unsubstituted, saturated hydrocarbon group of 1 to 4 carbon atoms, alternatively 1 to 2 carbon atoms. $R^{12}$ is exemplified by methyl, ethyl, propyl, and butyl.

Examples of suitable epoxy-functional alkoxysilanes include 3-glycidoxypropyltrimethoxysilane, 3-glycidoxypropyltriethoxysilane, (epoxycyclohexyl)ethyldimethoxysilane, (epoxycyclohexyl)ethyldiethoxysilane and a combination thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and a combination thereof.

Component (I) may comprise an epoxy-functional siloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. Component (I) may comprise a combination of an epoxy-functional alkoxysilane and an epoxy-functional siloxane. For example, component (I) is exemplified by a mixture of 3-glycidoxypropyltrimethoxysilane and a reaction product of hydroxy-terminated methylvinylsiloxane with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methylinyl/dimethylsiloxane copolymer. When used as a physical blend rather than as a reaction product, these components may be stored separately in multiple-part kits.

Suitable transition metal chelates include titanates, zirconates such as zirconium acetylacetonate, aluminum chelates such as aluminum acetylacetonate, and a combination thereof. Transition metal chelates and methods for their preparation are known in the art, see for example, U.S. Pat. No. 5,248,715, EP 0 493 791 A1, and EP 0 497 349 B1.

The adhesive composition of this invention may be a one-part composition comprising components (A) through (C) in a single part or, alternatively, a multi-part composition comprising components (A) through (C) in two or more parts. In a multi-part composition, components (A), (B), and (C) are typically not present in the same part unless an inhibitor is also present. A multi-part adhesive composition may comprise a first part containing a portion of component (A) and of component (B) and a second part containing the remaining portion of component (A) and all of component (C).

The one-part silicone composition of the instant invention may be prepared by combining components (A) through (C) and any optional components in the stated amounts at ambient temperature with or without the aid of a solvent, which is described above. Although the order of addition of the various components is not critical if the silicone composition is to be used immediately, the hydrosilylation catalyst may be added last at a temperature below about 30° C. to prevent premature curing of the composition. Also, the multi-part silicone composition of the present invention can be prepared by combining the particular components designated for each part.

Method

This invention relates to a wafer bonding method. The method comprises:

(1) applying an addition reaction curable adhesive composition to a first substrate optionally (2) heating the product of step (1);

thereby forming a film (3) applying a second substrate to the film, where at least one of the first substrate and the second substrate is a semiconductor wafer, (4) curing the film to form a cured film, (5) processing the semiconductor wafer, and (6) removing the cured film with an etching solution.

Step (1) may be performed using any conventional method, such as spin coating, dipping, spraying, or printing. Alternatively, the adhesive composition is applied by spin coating at a speed of 500 to 6,000 rpm for 5 to 60 seconds. The volume of adhesive composition applied in the spin coating method may be from 0.1 to 5 milliliters (mL). The spin speed, spin time, and volume of adhesive composition can be adjusted to produce a film having a thickness of 0.1 to 200 micrometers (μm). The first substrate may be a semiconductor wafer or a wafer carrier. The adhesive composition may be applied to the surface of a semiconductor wafer having a patterned feature or a device disposed thereon, for example integrated circuits or MicroElectro Mechanical Systems (MEMS) devices.

Step (2) may be performed by heating the adhesive composition by any conventional means. The time and temperature for heating depends on the specific adhesive composition selected and the purpose of step (2). Step (2) may be performed for the purpose of removing at least some of the solvent, when a solvent is present in the adhesive composition; or partially curing the adhesive composition; or both. For solvent removal of the hydrosilylation curable adhesive composition described above, step (2) may be performed at a temperature and for a time sufficient to remove the solvent, but where the temperature is lower than the temperature at which the hydrosilylation curable adhesive composition cures, for example by heating at 50° C. to 120° C. for up to 5 minutes. For partial cure of the hydrosilylation curable adhesive composition described above, step (2) may be performed by heating the hydrosilylation curable adhesive composition at a temperature of up to 200° C. for 1 to 30 minutes; alternatively by heating the hydrosilylation curable adhesive composition at a temperature of 80° C. to 200° C. for 2 to 4 minutes.

Step (3) may be performed by any conventional means. For example, the second substrate may be contacted with the film and pressed together.

Step (4) may be performed by heating the film at a temperature and for a time sufficient to cure the film, for example for the hydrosilylation curable adhesive composition described above, step (4) may be performed by heating at a temperature of 150° C. to 250° C. for 30 to 120 minutes.

Step (5) may be performed by any conventional means, such as thinning, electroplating, metallization, plasma treatment, photoresist processing, dielectric coating, and a combination thereof. The etching solution may comprise (i) an organic solvent and (ii) a base or an acid. The organic solvent may be, for example, a monohydric alcohol such as methanol, ethanol, n-propanol, isopropanol, n-butanol, isobutanol, tert-butanol, and a combination thereof; a dihydric alcohol such as ethylene glycol and propylene glycol and a combination thereof; a monoether such as ethylene glycol ether and propylene glycol ether and a combination thereof; a diether such as ethylene diglycol ether, propylene diglycol ether, 1-methoxy-2-propanol, and a combination thereof; a polar aprotic solvent such as N-methyl pyrrolidone, tetrahydrofuran, dimethylsulfoxide, gamma-butyrolactone, and dimethylacetamide, and a combination thereof.

The etching solutions may include water, but the amount of water is less than or equal to 25% by weight of the etching solution, alternatively less than or equal to 6% by weight of the etching solution, alternatively less than or equal to 3% by weight of the etching solution, and alternatively the etching solution may be anhydrous. Without wishing to be bound by theory it is thought that water may slow the time for removal of the film.

The base may comprise an inorganic base such as ammonium hydroxide, cesium hydroxide, potassium hydroxide, sodium hydroxide, and a combination thereof. Alternatively, the base may comprise an organic base such as phosphazene; tetraalkyl ammonium hydroxides including tetramethyl ammonium hydroxide, tetraethyl ammonium hydroxide, tetrabutyl ammonium hydroxide and tetrapropylammonium hydroxide; and a combination thereof. The amount of base in the etching solution may be at least 0.01%, up to as high as the solubility limit of the base in the solvent, alternatively up to 10%.

The acid may comprise an inorganic acid such as hydrochloric acid, hydrofluoric acid, nitric acid, sulfuric acid, or a combination thereof. Alternatively, the acid may comprise an organic acid such as an organosulfonic acid. Examples of organosulfonic acids include dodecylbenzene sulfonic acid, methylsulfonic acid, toluene sulfonic acid, and a combination thereof. The amount of acid in the etching solution may be at least 0.01%, up to as high as the solubility limit of the acid in the solvent, alternatively up to 10%.

The etching solution may be applied by any conventional method, including spraying or immersion. Exposure to the etching solution may be, for example, by immersion. The exact time and temperature for immersion depends on various factors including whether heating is performed during step (6), and the exact components of the adhesive composition. However, immersion may be carried out at ambient temperature for 1 minute to 72 hours, alternatively 24 hours to 72 hours. Immersion times may be shorter at elevated temperatures. Alternatively, exposure to the etching solution may be by continuous spraying such that the film is exposed to the etching solution for a time sufficient to remove the film. Exposure to the etching solution be at ambient or elevated temperatures. The temperature during exposure may be 15° C. to 150° C. It is expected that higher temperatures will provide higher etch rates.

EXAMPLES

These examples are intended to illustrate the invention to one of ordinary skill in the art and should not be interpreted as limiting the scope of the invention set forth in the claims.

Example 1

A composition is prepared by dissolving (A1) 71% vinyl functional silicone resin and (B1) 29% of Si—H functional polydimethylsiloxanes in (D1) mesitylene. To this is added 20 parts per million (ppm) of (C1) platinum acetylacetonate and the resulting adhesive composition is spin coated on a wafer. The wafer is then soft baked to remove the residual mesitylene solvent. A second wafer is then placed on the resulting film, and the film is cured at 250° C. for 2 minutes. The wafers adhere to each other.

Example 2

A hydrosilylation curable adhesive composition is applied to the surface of a semiconductor wafer. One hydrosilylation curable adhesive composition in this example is DOW CORNING® WL-5150, which is commercially available from Dow Corning Corporation of Midland, Mich., U.S.A. A second hydrosilylation curable adhesive composition in this example comprises: 58 parts MQ resin comprising $Me_3SiO_{1/2}$ and $Me_2ViSiO_{1/2}$ units, 21 parts trimethylsiloxy-terminated dimethyl, methylhydrogensiloxane, 16 parts 1,3,5-trimethylbenzene, and less than 0.1% platinum acetylacetonate. Each wafer is heated at a temperature to remove solvent and form a film. The temperatures and adhesive compositions are shown in Table 1.

A wafer carrier, which is permeable to an etching solution, is segmented into 1 square inch (2.54 square centimeter) coupons. Three coupons per wafer are applied to the film on the wafer by finger pressure for two seconds. The film is cured by heating at 250° C. for 30 minutes.

Each wafer is placed in a petri dish and covered with 40 mL of an etching solution containing 6% tetramethylammonium hydroxide pentahydrate and 94% isopropanol. After 30 minutes, an additional 50 mL of the etching solution is added to each petri dish. The dishes are then gently agitated on a moving table for an amount of time, shown in Table 1.

At each time interval, the coupons are tested for release by applying a mild to moderate amount of shear pressure to the wafer by hand using a spatula. The number of coupons that are released and relative force that is applied are shown in Table 1.

tion reaction curable composition is a hydrosilylation reaction curable composition comprising:
(A) a polyorganosiloxane containing an average of at least two silicon-bonded unsaturated organic groups per molecule,
(B) an organosilicon compound containing an average of at least two silicon-bonded hydrogen atoms per molecule in an amount sufficient to cure the composition,
(C) a catalytic amount of a hydrosilylation catalyst,
optionally (D) a solvent,
optionally (E) an inhibitor,
optionally (F) a filler,
optionally (G) a treating agent,
optionally (H) a spacer,
optionally (I) an adhesion promoter,
optionally (J) a surfactant, and
optionally (K) a colorant;
optionally (2) heating the product of step (1),
(3) applying a second substrate to the film, where at least one of the first substrate and the second substrate is a semiconductor wafer,
(4) curing the film to form a cured film,
(5) processing the semiconductor wafer, and
(6) removing the cured film with an etching solution.

2. The method of claim 1, where step (1) is performed by a technique selected from spin coating, spray coating, dipping, or printing.

3. The method of claim 1, where component (A) is an alkenyl-functional polyorganosiloxane resin.

4. The method of claim 1, where component (B) is an organohydrogenpolysiloxane containing an average of at least two silicon bonded hydrogen atoms per molecule.

TABLE 1

| Sample | Adhesive Composition | Solvent Removal Temperature (° C.) | Number of Coupons Released after 0 Hours | Number of Coupons Released after 8 Hours | Number of Coupons Released after 24 Hours | Number of Coupons Released after 48 Hours |
|---|---|---|---|---|---|---|
| 1 | Second | 0 | 0 | 0 | 0 | 0 |
| 2 | Second | 150 | 0 | 0 | 0 | Stopped test |
| 3 | Second | 165 | 0 | 0 | 2 (Mod) | Stopped test |
| 4 | Second | 180 | 2 | 0 | 1 (Mod) | Stopped test |
| 5 | Second | 200 | 2 | 0 | 1 (Lite) | Stopped test |
| 6 | WL-5150 | 0 | 0 | 0 | 0 | 1 (Mod) |
| 7 | WL-5150 | 150 | 0 | 0 | 0 | 3 (2 Mod) & (1 Lite) |
| 8 | WL-5150 | 165 | 0 | 0 | 1 (Mod) | Stopped test |
| 9 | WL-5150 | 180 | 0 | 0 | 2 (Mod) | Stopped test |
| 10 | WL-5150 | 200 | 0 | 0 | 1 (Lite) | 1 (Mod) |

(Mod) means moderate force is required to release the coupon.
(Lite) means that light force is required to release the coupon.

INDUSTRIAL APPLICABILITY

Addition reaction curable adhesive compositions are useful in methods for temporary wafer bonding. The addition reaction curable adhesive compositions may be cured to form films that can be thermally stable, chemically inert, and removed using commercially available etching solutions.

The invention claimed is:
1. A method comprising:
(1) forming a film by applying an addition reaction curable adhesive composition to a first substrate, where the addi-

5. The method of claim 1, where component (C) is platinum acetylacetonate.

6. The method of claim 1, where component (D) is mesitylene.

7. The method of claim 1, where the first substrate is a first semiconductor wafer and the second substrate is a second semiconductor wafer.

8. The method of claim 1, where component (D) is present, and step (2) is performed by heating at a temperature of 50 to 120° C. for up to 5 minutes to remove component (D).

9. The method of claim 1, where step (4) is performed by heating at a temperature of 150 to 250 0C for 30 to 120 minutes.

10. The method of claim 1, where the etching solution comprises an organic solvent containing an acid or a base capable of dissolving the film.

11. The method of claim 1, where step (6) is performed by immersion.

12. The method of claim 8, where step (2) further comprises heating at a temperature of up to 200° C. for 1 to 30 minutes to partially cure the film.

13. The method of claim 10, where the organic solvent is selected from the group consisting of a monohydric alcohol, a dihydric alcohol, a monoether, a diether, a polar aprotic solvent, and a combination thereof.

14. The method of claim 10, where the etching solution further comprises an amount of water less than or equal to 3% by weight of the etching solution.

15. The method of claim 10, where the etching solution is anhydrous.

16. The method of claim 10, where the base is selected from the group consisting of ammonium hydroxide, cesium hydroxide, potassium hydroxide, sodium hydroxide, and a combination thereof.

17. The method of claim 10, where the base is selected from the group consisting of phosphazene, a tetraalkyl ammonium hydroxide, a combination thereof.

18. The method of claim 10, where the acid is selected from the group consisting of hydrochloric acid, hydrofluoric acid, nitric acid, sulfuric acid, and a combination thereof.

19. The method of claim 10, where the acid comprises an organosulfonic acid.

* * * * *